(12) United States Patent
Ikeda et al.

(10) Patent No.: US 10,319,704 B2
(45) Date of Patent: Jun. 11, 2019

(54) SEMICONDUCTOR MODULE

(71) Applicant: SHINDENGEN ELECTRIC MANUFACTURING CO., LTD., Chiyoda-ku, Tokyo (JP)

(72) Inventors: Kosuke Ikeda, Saitama (JP); Yuji Morinaga, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 36 days.

(21) Appl. No.: 15/739,424

(22) PCT Filed: Jan. 31, 2016

(86) PCT No.: PCT/JP2016/052842
§ 371 (c)(1),
(2) Date: Dec. 22, 2017

(87) PCT Pub. No.: WO2017/130420
PCT Pub. Date: Aug. 3, 2017

(65) Prior Publication Data
US 2018/0182745 A1   Jun. 28, 2018

(51) Int. Cl.
*H01L 25/16* (2006.01)
*H01L 23/29* (2006.01)
(Continued)

(52) U.S. Cl.
CPC ............ *H01L 25/165* (2013.01); *H01L 23/10* (2013.01); *H01L 23/24* (2013.01); *H01L 23/29* (2013.01);
(Continued)

(58) Field of Classification Search
None
See application file for complete search history.

(56) References Cited

U.S. PATENT DOCUMENTS 6,495,914 B1   12/2002   Sekine et al.

FOREIGN PATENT DOCUMENTS

JP   10-12812 A   1/1998
JP   10-56131 A   2/1998
(Continued)

OTHER PUBLICATIONS

International Search Report in PCT/JP2016/052842, dated Apr. 19, 2016, 4pp.
(Continued)

*Primary Examiner* — Long Pham
(74) *Attorney, Agent, or Firm* — Hauptman Ham, LLP

(57) ABSTRACT

A semiconductor module includes: a first substrate having a first insulating substrate and a first conductor layer; a power device part having a first electrode, a second electrode and a gate electrode; a second substrate having a second insulating substrate and a second conductor layer, wherein the second conductor layer has a bonding portion and a surrounding wall portion formed at a position which surrounds the bonding portion as viewed in a plan view; an inner resin portion; a control IC; and an outer resin portion, wherein the power device part is disposed such that the gate electrode is positioned outside a region defined by the surrounding wall portion as viewed in a plan view, and the gate electrode is electrically connected to an output terminal of the control IC through a connecting member.

12 Claims, 10 Drawing Sheets

(51) Int. Cl.
    *H01L 23/31*     (2006.01)
    *H01L 23/48*     (2006.01)
    *H01L 25/07*     (2006.01)
    *H01L 25/18*     (2006.01)
    *H01L 23/10*     (2006.01)
    *H01L 23/24*     (2006.01)
    *H01L 23/367*     (2006.01)
    *H01L 23/373*     (2006.01)
    *H01L 23/00*     (2006.01)
    *H01L 23/433*     (2006.01)

(52) U.S. Cl.
    CPC .......... *H01L 23/31* (2013.01); *H01L 23/3121* (2013.01); *H01L 23/3675* (2013.01); *H01L 23/3735* (2013.01); *H01L 23/4334* (2013.01); *H01L 23/48* (2013.01); *H01L 24/32* (2013.01); *H01L 24/33* (2013.01); *H01L 24/48* (2013.01); *H01L 24/73* (2013.01); *H01L 25/07* (2013.01); *H01L 25/18* (2013.01); *H01L 24/83* (2013.01); *H01L 2224/32145* (2013.01); *H01L 2224/32245* (2013.01); *H01L 2224/33181* (2013.01); *H01L 2224/451* (2013.01); *H01L 2224/48091* (2013.01); *H01L 2224/48106* (2013.01); *H01L 2224/48137* (2013.01); *H01L 2224/73215* (2013.01); *H01L 2224/73265* (2013.01); *H01L 2224/83801* (2013.01); *H01L 2924/13055* (2013.01); *H01L 2924/14* (2013.01)

(56) References Cited

FOREIGN PATENT DOCUMENTS

| | | |
|---|---|---|
| JP | 11-97616 A | 4/1999 |
| JP | 2006-134990 A | 5/2006 |
| JP | 2008-103552 A | 5/2008 |
| JP | 2011-151103 A | 8/2011 |
| JP | 2013-69942 A | 4/2013 |
| WO | 2016/117075 A1 | 7/2016 |

OTHER PUBLICATIONS

International Search Report in PCT/JP2015/051655, dated Mar. 24, 2015, 4pp.

SEMICONDUCTOR MODULE

RELATED APPLICATIONS

The present application is a National Phase of International Application Number PCT/JP2016/052842, filed Jan. 31, 2016.

TECHNICAL FIELD

The present invention relates to a semiconductor module.

BACKGROUND ART

Conventionally, there has been known a semiconductor module having a substrate and a semiconductor element (see patent literature 1, for example).

As shown in FIG. 12, the conventional semiconductor module 8 includes: a substrate 810 having an insulating substrate 811, a conductor layer 812 formed on one surface of the insulating substrate 811 and other conductor layers 813, 814 formed at positions spaced apart from the conductor layer 812; a device part (semiconductor element) 820 having a first electrode 821 on one surface (a lower-side surface in FIG. 12) and two second electrodes 822, 823 on the other surface (an upper-side surface in FIG. 12) and making the first electrode 821 and the conductor layer 812 bonded to each other; a wall portion 816 formed along an outer periphery of the insulating substrate 811, a resin portion 860 formed in a state where a resin is disposed in a recessed space which is defined by the insulating substrate 811 and the wall portion 816; a resin-made lid portion 862 disposed on an upper surface of the resin portion 860; and terminals 874, 876 for external connection where one-side ends of the terminals 874, 876 are electrically connected to the other conductor layers 813, 814, and the terminals 874, 876 extend toward the outside (vertically upward) through the resin portion 860 and the lid portion 862 from the one-side ends.

Out of two second electrodes 822, 823 of the semiconductor element 820, one second electrode 822 is electrically connected to the terminal 874 through a wire 870 and the other conductor layer 813, and the other second electrode 823 is electrically connected to the terminal 876 through a wire 872.

The conventional semiconductor module 8 has the resin portion 860 which is formed by disposing a resin in the recessed space defined by the substrate 810 and the wall portion 816 thus providing a semiconductor module having impact resistance.

Recently, in the technical field of semiconductor modules, there has been a demand for a semiconductor module where the structure for resin sealing can be easily formed.

Under such circumstances, inventors of the present invention have come up with a semiconductor module where the structure for resin sealing can be easily formed, and already filed international patent application PCT/JP2015/051655 (hereinafter, referred to as prior patent application) as a prior patent application.

As shown in FIG. 13, a semiconductor module 9 relating to the prior patent application includes:

a first substrate 910 having a first insulating substrate 911 and a first conductor layer 912 which is formed on at least one surface of the first insulating substrate 911;

a device part (semiconductor element) 920 having a first electrode 921 on one surface thereof and a second electrode 922 on the other surface thereof and having the first electrode 921 bonded to the first conductor layer 912;

a second substrate 930 having a second insulating substrate 931 and a second conductor layer 932 formed on at least one surface of the second insulating substrate 931, wherein the second conductor layer 932 has a bonding portion 933 bonded to the second electrode 922 and a surrounding wall portion 934 formed at a position which surrounds the bonding portion 933 as viewed in a plan view in a state where an upper end surface of the surrounding wall portion 934 projects from a bonding surface between the bonding portion 933 and the second electrode 922, and the second substrate 930 is brought into contact with the first substrate 910 by way of the surrounding wall portion 934; and a resin portion 940 made of a resin and disposed in a space defined by the surrounding wall portion 934 and sandwiched between the first insulating substrate 911 and the second insulating substrate 931.

In the semiconductor module 9 according to the prior patent application, the whole device part 920 is positioned inside a region defined by the surrounding wall portion 934 as viewed in a plan view.

In the semiconductor module 9 according to the prior patent application, the second conductor layer 932 includes the surrounding wall portion 934 formed at the position which surrounds the bonding portion 933 as viewed in a plan view in a state where an upper end surface of the surrounding wall portion 934 projects from the bonding surface between the bonding portion 933 and the second electrode 922. Accordingly, it is unnecessary to additionally prepare a member for forming the structure for resin sealing (for example, the wall portion 816 in the conventional semiconductor module 8) and hence, the structure for resin sealing can be formed easily.

Further, according to the semiconductor module 9 of the prior patent application, the second electrode 922 of the device part 920 is bonded to the second conductor layer 932. Accordingly, by electrically connecting the second conductor layer 932 to a terminal for external connection, it is possible to electrically connect the second electrode 922 of the device part 920 and the terminal for external connection with each other through the second conductor layer 932 having a larger cross-sectional area than a wire and having a lower resistance than the wire. Accordingly, a drawback minimally occurs in the semiconductor module 9 when a large electric current is supplied to the semiconductor module 9 and hence, the semiconductor module 9 according to the prior patent application provides a semiconductor module having higher reliability than conventional semiconductor modules.

Further, in the semiconductor module 9 according to the prior patent application, the second electrode 922 of the device part 920 is bonded to the second conductor layer 932 formed on the one surface of the second insulating substrate 931. With such a configuration, in addition to the radiation of heat generated by the device part 920 to the outside through the first conductor layer 912 and the first insulating substrate 911, such heat can be radiated to the outside through the second conductor layer 932 and the second insulating substrate 931. Accordingly, the semiconductor module 9 according to the prior patent application provides a semiconductor module having higher heat radiation property than conventional semiconductor modules.

CITATION LIST

Patent Literature

PTL 1: JP-A-2006-134990

SUMMARY OF INVENTION

Technical Problem

In such a semiconductor module, in the case where a power device part (power semiconductor element) having a gate electrode is used as a device part, and the power device part is controlled by a control IC, since the control IC has the fine structure, it is preferable that an output terminal of the control IC and the gate electrode be connected with each other through a connecting member having a small diameter (for example, wire or the like).

However, in the semiconductor module 9 according to the prior patent application, the bonding portion 933 of the second substrate 930 and the second electrode 922 of the device part 920 are bonded to each other (that is, the second substrate 930 is disposed on the device part 920) and, further, the device part 920 is disposed such that the whole device part 920 is positioned inside the region defined by the surrounding wall portion 934 as viewed in a plan view. Accordingly, in the case where the power device part (power semiconductor element) having the gate electrode is used as the device part, there arises a drawback that the gate electrode of the power device part and the output terminal of the control IC cannot be connected with each other through a connecting member (wire or the like) having a small diameter.

The present invention has been made to overcome the above-mentioned drawbacks, and it is an object of the present invention to provide a semiconductor module capable of controlling a power device part using a control IC by connecting agate electrode of the power device part and an output terminal of the control IC by a connecting member having a small diameter even when a second substrate is disposed on a large portion of the power device part.

Solution to Problem

[1] A semiconductor module of the present invention includes: a first substrate having a first insulating substrate and a first conductor layer which is formed on at least one surface of the first insulating substrate; a power device part having a first electrode on one surface thereof and a second electrode and a gate electrode on the other surface thereof and having the first electrode bonded to the first conductor layer; a second substrate having a second insulating substrate and a second conductor layer formed on at least one surface of the second insulating substrate, wherein the second conductor layer has a bonding portion bonded to the second electrode and a surrounding wall portion formed at a position which surrounds the bonding portion as viewed in a plan view in a state where an upper end surface of the surrounding wall portion projects from a bonding surface between the bonding portion and the second electrode, and the second substrate is brought into contact with the first substrate by way of the surrounding wall portion; an inner resin portion made of a resin and disposed in a space defined by the surrounding wall portion and sandwiched between the first insulating substrate and the second insulating substrate; a control IC disposed at a position being spaced apart from the power device part; and an outer resin portion made of a resin and disposed on one surface side of the first substrate so as to cover at least the second substrate and the control IC, wherein the power device part is disposed such that the gate electrode is positioned outside a region defined by the surrounding wall portion as viewed in a plan view, and the gate electrode is electrically connected to an output terminal of the control IC through a predetermined connecting member.

In this specification, "a surrounding wall portion formed at a position which surrounds the bonding portion" includes not only the case where the surrounding wall portion is formed around the whole circumference of the bonding portion but also the case where the surrounding wall portion is formed around only a portion of the circumference of the bonding portion. In this specification, "cover at least the second substrate and the control IC" includes not only the case where the outer resin portion covers the second substrate and the control IC but also the case where the outer resin portion covers, besides the second substrate and the control IC, the gate electrode of the power device part, a portion of the first insulating substrate, some of the respective conductor layers and/or the connecting members and the like.

[2] In the semiconductor module of the present invention, it is preferable that the surrounding wall portion be formed only at a predetermined portion of a position which surrounds the bonding portion as viewed in a plan view.

[3] In the semiconductor module of the present invention, it is preferable that the power device part be formed of one semiconductor element, and the semiconductor element has a first electrode on one surface thereof and have the second electrode and the gate electrode on the other surface thereof.

[4] In the semiconductor module of the present invention, it is preferable that the power device part have the structure where a plurality of semiconductor elements are stacked, both of at least two semiconductor elements among the plurality of semiconductor elements have a first electrode on one surface thereof and have the second electrode and the gate electrode on the other surface thereof, and the at least two semiconductor elements be stacked such that the at least two semiconductor elements are positioned at a position where the gate electrodes of the at least two respective semiconductor elements do not overlap with each other as viewed in a plan view.

[5] In the semiconductor module of the present invention, it is preferable that the power device part have the structure where a plurality of semiconductor elements are stacked, and at least one semiconductor element among the plurality of semiconductor elements have a first electrode on one surface thereof and have the second electrode and the gate electrode on the other surface thereof.

[6] In the semiconductor module of the present invention, it is preferable that the surrounding wall portion be formed continuously with the bonding portion, the first substrate further has a third conductor layer which is bonded to the surrounding wall portion at a position spaced apart from the first conductor layer on one surface of the first insulating substrate, and the third conductor layer be electrically connected to the second electrode through the surrounding wall portion and the bonding portion.

[7] In the semiconductor module of the present invention, it is preferable that a groove portion which engages with the surrounding wall portion be formed on the third conductor layer.

[8] In the semiconductor module of the present invention, it is preferable that the surrounding wall portion be formed in a state where the surrounding wall portion is spaced apart from the bonding portion.

[9] In the semiconductor module of the present invention, it is preferable that the first substrate further have a third conductor layer which is bonded to the surrounding wall portion at a position spaced apart from the first conductor layer on one surface of the first insulating substrate, and a groove portion which engages with the surrounding wall portion be formed on the third conductor layer.

[10] In the semiconductor module of the present invention, it is preferable that a power-device-part mounting conductor layer be formed on the other surface of the second substrate, and a second power device part be disposed on the power-device-part mounting conductor layer.

[11] In the semiconductor module of the present invention, it is preferable that the second power device part have a first electrode which is electrically connected to the power-device-part mounting conductor layer on one surface thereof, a hole be formed in the second insulating substrate at a position corresponding to the bonding portion, a second connecting member be disposed in the inside of a hole formed in the second insulating substrate; and the first electrode of the second power device part be electrically connected to the second electrode of the power device part through the second connecting member.

[12] In the semiconductor module of the present invention, it is preferable that the bonding portion and the surrounding wall portion be formed of one copper layer.

Advantageous Effects of Invention

According to the semiconductor module of the present invention, the power device part is disposed such that the gate electrode is positioned outside a region defined by the surrounding wall portion as viewed in a plan view. With such a configuration, even in the case where the second substrate is disposed over the most portion of the power device part, the gate electrode of the power device part and the output terminal of the control IC can be connected with each other by a bonding member having a small diameter (wire or the like). As a result, it is possible to provide a semiconductor module where the power device part can be controlled by the control IC as the semiconductor module of the present invention.

Further, according to the semiconductor module of the present invention, the second conductor layer has the surrounding wall portion which is formed at the position which surrounds the bonding portion as viewed in a plan view. Accordingly, even in the case where the inner resin portion ignites due to the generation of heat which occurs as a result of applying an excessive load to the power device part, the surrounding wall portion plays a role of a fire wall so that spreading of fire to the surrounding can be prevented.

Still further, according to the semiconductor module of the present invention, the second conductor layer has the surrounding wall portion which is formed at the position which surrounds the bonding portion as viewed in a plan view. Accordingly, it is possible to shield the power device part from the outside by the surrounding wall portion and hence, it is possible to prevent the occurrence of a phenomenon that oscillations are generated in the power device part due to noises from the outside of the power device part. As a result, it is possible to provide a semiconductor module where drawbacks caused by oscillations can be minimized as the semiconductor module of the present invention.

BRIEF DESCRIPTION OF DRAWINGS

FIG. 1A and FIG. 1B are views showing a semiconductor module 1 of an embodiment 1, wherein FIG. 1A is a cross-sectional view of the semiconductor module 1, and FIG. 1B is a planer cross-sectional view of the semiconductor module 1 taken along a line A-A in FIG. 1A.

FIG. 2A and FIG. 2B are views for describing a second substrate 30, wherein FIG. 2A is a plan view of the second substrate 30, and FIG. 2B is a cross-sectional view of the semiconductor module 2 taken along a line B-B in FIG. 2A.

FIG. 3A and FIG. 3B are views showing a semiconductor module 2 according to an embodiment 2, wherein FIG. 3A is a cross-sectional view of the semiconductor module 2, and FIG. 3B is a planer cross-sectional view of the semiconductor module 2 taken along a line C-C in FIG. 3A.

FIG. 6A and FIG. 6B are views showing a semiconductor module 4 according to an embodiment 4, wherein FIG. 6A is a cross-sectional view of the semiconductor module 4, and FIG. 6B is a planar cross-sectional view of the semiconductor module 4 taken along a line D-D in FIG. 6A.

FIG. 8A and FIG. 8B are views for describing a second substrate 30a, wherein FIG. 8A is a plan view of the second substrate 30a, and FIG. 8B is a cross-sectional view of the semiconductor module 5 taken along a line E-E in FIG. 8A.

DESCRIPTION OF EMBODIMENTS

Hereinafter, a semiconductor module of the present invention is described in conjunction with an embodiment shown in drawings.

Embodiment 1

1. Configuration of Semiconductor Module 1 of Embodiment 1

Figure 1A:
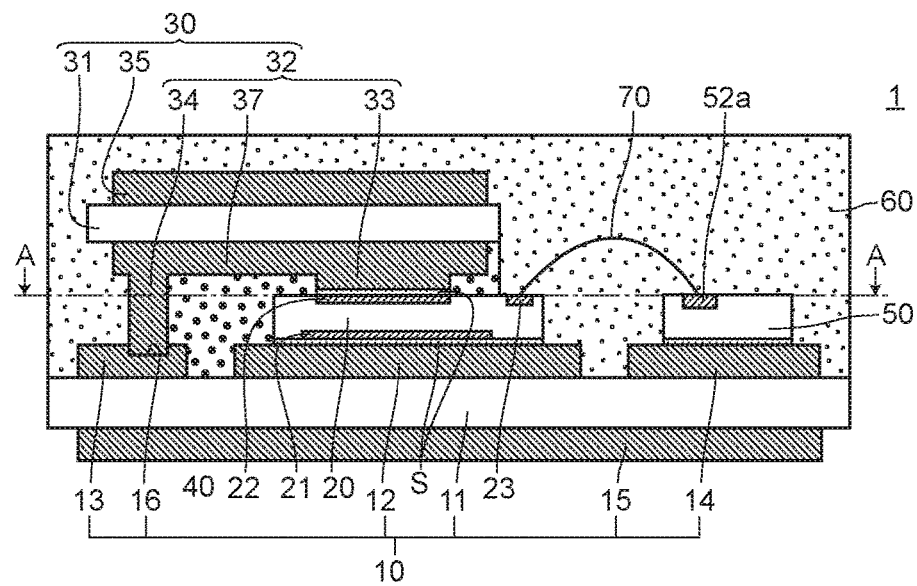

As shown in FIG. 1, a semiconductor module 1 of the embodiment 1 includes: a first substrate 10; a power device part: a second substrate 30; an inner resin portion 40; a control IC 50; an outer resin portion 60; and a wire (connecting member) 70.

The first substrate 10 is a mounting substrate which has: a first insulating substrate 11; a first conductor layer 12 formed on one surface of the first insulating substrate 11: a third conductor layer 13 bonded to a surrounding wall portion 34 described later at a position spaced apart from the first conductor layer 12; a fourth conductor layer 14 disposed at a position spaced apart from the first conductor layer 12 and the third conductor layer 13, wherein the control IC 50 being disposed on the fourth conductor layer 14; and a heat radiation conductor layer 15 formed on the other surface of the first insulating substrate 11.

In the first substrate 10, the first insulating substrate 11 is made of ceramics (for example, alumina), while the first conductor layer 12, the third conductor layer 13, the forth conductor layer 14 and the heat radiation conductor layer 15 are made of metal (for example, copper). The first substrate 10 is a DCB substrate (direct copper bonding substrate) where the first insulating substrate 11 and the respective conductor layers are bonded to each other by eutectic bonding. With such a configuration, it is possible to provide the semiconductor module having high heat radiation property.

A groove portion 16 which engages with a surrounding wall portion 34 described later is formed on the third conductor layer 13. The groove portion 16 is formed by etching the third conductor layer 13. The third conductor layer 13 is connectable with the outside, since a portion of the third conductor layer 13 is not covered by a resin or the third conductor layer 13 is electrically connected with a terminal for external connection.

The power device part is formed of one semiconductor element 20. A first electrode 21 is formed on one surface (a lower side in FIG. 1) of the semiconductor element 20, and a second electrode 22 and a gate electrode 23 are formed on the other surface (an upper side in FIG. 1) of the semiconductor element 20. The power device part is disposed such that the gate electrode 23 is positioned outside a region defined by the surrounding wall portion 34 as viewed in a plan view. The semiconductor element 20 is a semiconductor element having three terminals (for example, IGBT).

The gate electrode 23 is electrically connected to an output terminal 52 of the control IC 50 through a wire 70 described later. The first electrode 21 is bonded to the first conductor layer 12 by a bonding material S (for example, solder), and the second electrode 22 is bonded to a bonding portion 33 of the second substrate 30 described later by the bonding material S (for example, solder).

Figure 1B:
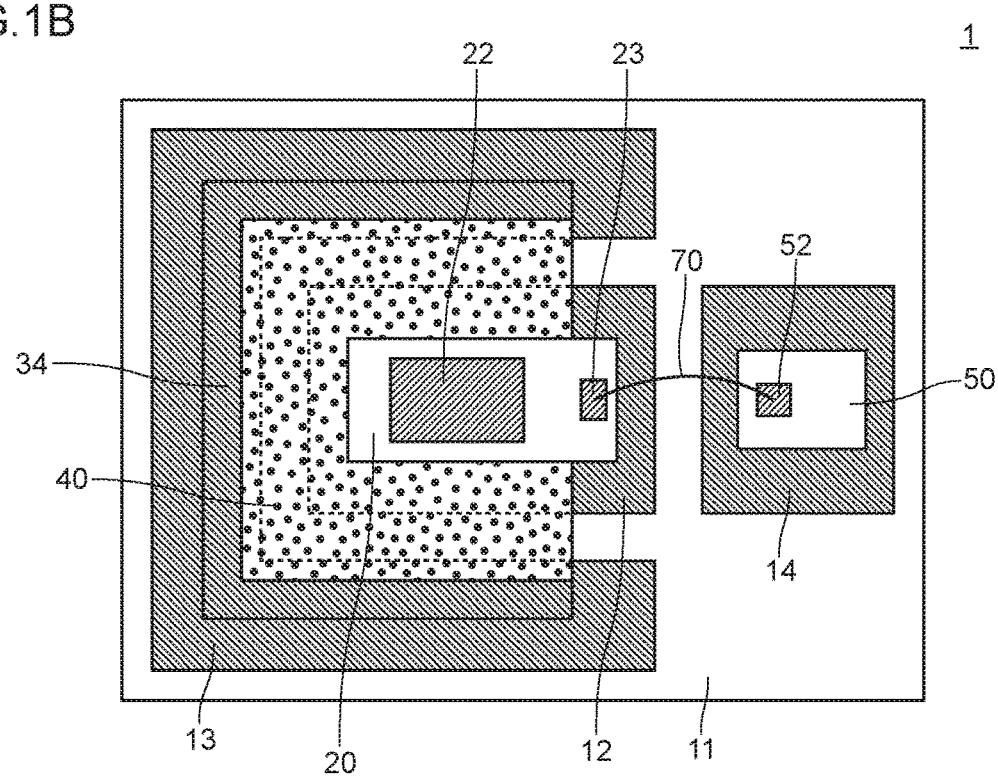
Figure 2A:
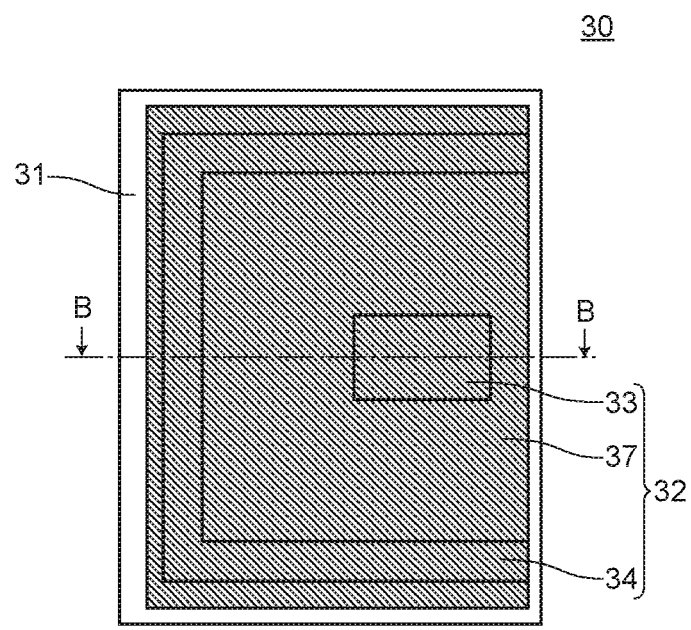
Figure 2B:
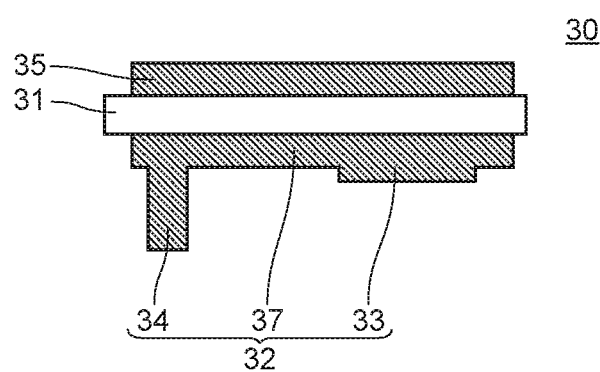

As shown in FIG. 1 and FIG. 2, the second substrate 30 has: a second insulating substrate 31; a second conductor layer 32 formed on one surface of the second insulating substrate 31; and a heat radiation conductor layer 35 formed on the other surface of the second insulating substrate 31. The second conductor layer 32 has: a bonding portion 33 bonded to the second electrode 22; the surrounding wall portion 34 formed at a position which surrounds the bonding portion 33 as viewed in a plan view in a state where an upper end surface of the surrounding wall portion 34 projects from a bonding surface between the bonding portion 33 and the second electrode 22; and a flat portion 37. The second conductor layer 32 is brought into contact with the third conductor layer 13 of the first substrate 10 through the surrounding wall portion 34.

In the second substrate 30, the second insulating substrate 31 is made of ceramics (for example, alumina) while the second conductor layer 32 and the heat radiation conductor layer 35 are made of metal (for example copper). The second substrate 30 is a DCB substrate where the second insulating substrate 31 and the respective conductor layers are bonded to each other by eutectic bonding. The bonding portion 33 and the surrounding wall portion 34 are formed by etching one copper layer. With such a configuration, the bonding portion 33 and the surrounding wall portion 34 can be formed with high accuracy.

The surrounding wall portion 34 is formed only at a position which surrounds ¾ of the whole circumference of the bonding portion 33 of the position which surrounds the bonding portion 33 as viewed in a plan view (see FIG. 1B). That is, the surrounding wall portion 34 has a U shape as viewed in a plan view.

The surrounding wall portion 34 is formed continuously with the bonding portion 33 by way of the flat portion 37 of the second conductor layer 32. The surrounding wall portion 34 engages with the groove portion 16 formed on the third conductor layer 13 of the first substrate 10, and is bonded to the groove portion 16 by a bonding material (for example, solder). With such a configuration, the third conductor layer 13 is electrically connected with the second electrode 22 through the surrounding wall portion 34 and the bonding portion 33.

A length from a boundary surface between the second insulating substrate 31 and the second conductor layer 32 to an upper end surface of the surrounding wall portion 34 is set to a value which falls within a range of from 0.2 to 1.0 mm. A thickness of the bonding portion 33 is set to a value which falls within a range of from 0.15 to 0.5 mm, for example.

As shown in FIG. 1, the inner resin portion 40 is made of a resin disposed in "a space defined by the surrounding wall portion 34 and sandwiched between the first insulating substrate 11 and the second insulating substrate 31". As the resin which is used for forming the inner resin portion 40, a suitable resin (for example, an epoxy resin) can be used. The inner resin portion 40 is formed by filling a resin into the space defined by the surrounding wall portion 34 and sandwiched between the first insulating substrate 11 and the second insulating substrate 31 through a space sandwiched by the first insulating substrate 11 and the second insulating substrate 31 at a portion of the position which surrounds the bonding portion 33 as viewed in a plan view where the surrounding wall portion 34 is not formed.

The control IC 50 controls driving of the power device part by controlling turning on or off of the gate electrode 23 of the power device part. The control IC 50 is disposed at a position spaced apart from the power device part through the fourth conductor layer 14 and a bonding material, (for example, solder). The control IC 50 has a predetermined output terminal 52, and the output terminal 52 and the gate electrode 23 are electrically connected with each other through the wire 70.

The outer resin portion 60 is made of a resin, and is disposed on one surface side of the first substrate 10 so as to cover the gate electrode 23 of the power device part, the second substrate 30 and the control IC 50. Although a resin equal to a resin for forming the inner resin portion 40 is used as the resin for forming the outer resin portion 60, a resin which differs from the resin for forming the inner resin portion 40 can be also used.

Any suitable wire can be used as the wire (connecting member) 70 provided that the wire 70 has a small diameter. For example, a metal line wire can be used as the wire 70.

2. Effect of Semiconductor Module 1 of Embodiment 1

According to the semiconductor module 1 of the embodiment 1, the power device part is disposed such that the gate electrode 23 is positioned outside a region defined by the surrounding wall portion 34 as viewed in a plan view. With such a configuration, even in the case where the second substrate 30 is disposed over the most portion of the power device part, the gate electrode 23 of the power device part and the output terminal 52 of the control IC 50 can be connected with each other by the wire 70 having a small diameter. As a result, it is possible to provide a semiconductor module where the power device part can be controlled by the control IC 50 as the semiconductor module 1 of the embodiment 1.

Further, according to the semiconductor module 1 of the embodiment 1, the second conductor layer 32 has the surrounding wall portion 34 which is formed at the position which surrounds the bonding portion 33 as viewed in a plan view. Accordingly, in the case where the inner resin portion 40 ignites due to the generation of heat which occurs as a result of applying an excessive load to the power device part, the surrounding wall portion 34 plays a role of a fire wall so that spreading of fire to the surrounding can be prevented.

Still further, according to the semiconductor module 1 of the embodiment 1, the second conductor layer 32 has the surrounding wall portion 34 having the above-mentioned configuration. Accordingly, it is possible to shield the power device part from the outside by the surrounding wall portion 34 and hence, it is possible to prevent the occurrence of a phenomenon that oscillations are generated in the power device part due to noises from the outside of the power device part. As a result, it is possible to provide a semiconductor module where drawbacks caused by oscillations can be minimized as the semiconductor module 1 of the embodiment 1.

In the semiconductor module 1 of the embodiment 1, the surrounding wall portion 34 is formed only at a predetermined portion of the position which surrounds the bonding portion 33 as viewed in a plan view. Accordingly, in forming the inner resin portion 40, a resin can be filled into the space defined by the surrounding wall portion 34 and sandwiched between the first insulating substrate 11 and the second insulating substrate 31 through "the space sandwiched by the first insulating substrate 11 and the second insulating substrate 31 at the portion of the position which surrounds the bonding portion 33 as viewed in a plan view where the surrounding wall portion 34 is not formed".

According to the semiconductor module 1 of the embodiment 1, the power device part is formed of one semiconductor element 20, and the semiconductor element 20 has the first electrode 21 on one surface thereof and has the second electrode 22 and the gate electrode 23 on the other surface thereof. Accordingly, it is possible to provide a semiconductor module where a design of wiring can be performed easily.

In the semiconductor module 1 of the embodiment 1, the surrounding wall portion 34 is formed continuously with the bonding portion 33, the first substrate 10 further includes a third conductor layer 13 which is bonded to the surrounding wall portion 34 at a position spaced apart from the first conductor layer 12 on one surface of the second insulating substrate 31, and the third conductor layer 13 is electrically connected to the second electrode 22 through the bonding portion 33 and the surrounding wall portion 34.

With such a configuration, the second electrode 22 of the power device part can be electrically connected to the outside through the bonding portion 33, the surrounding wall portion 34 and the third conductor layer 13. All of the bonding portion 33, the surrounding wall portion 34 and the third conductor layer 13 have larger cross-sectional areas and lower resistances than the wire and hence, when a large electric current is supplied to the semiconductor module, drawbacks minimally occur and hence, it is possible to provide a semiconductor module having further reliability.

According to the semiconductor module 1 of the embodiment 1, the semiconductor module 1 has the above-mentioned configuration and hence, heat generated by the power device part can be radiated to the outside through the bonding portion 33, the surrounding wall portion 34 and the third conductor layer 13 whereby it is possible to provide a semiconductor module having further heat radiation property.

According to the semiconductor module 1 of the embodiment 1, the groove portion 16 which engages with the surrounding wall portion 34 is formed on the third conductor layer 13. Accordingly, in steps of manufacturing the semiconductor module, at the time of mounting the second substrate 30 on the first substrate 10, it is possible to easily position the second substrate 30 by fitting the surrounding wall portion 34 of the second substrate 30 into the groove portion 16 of the third conductor layer 13.

According to the semiconductor module 1 of the embodiment 1, the bonding portion 33 and the surrounding wall portion 34 are formed of one copper layer. Accordingly, in the manufacturing steps of the semiconductor module, even when the semiconductor module 1 is introduced into a high temperature furnace for melting a bonding material (for example, solder), a length of the surrounding wall portion 34 minimally changes. Accordingly, a load applied to the second substrate 30 is dispersed to the surrounding wall portion 34 and hence, there is no possibility that the load applied to the second substrate 30 concentrates on the power device part. As a result, in the steps of manufacturing the semiconductor module, the power device part is minimally broken and hence, not only the semiconductor module can be manufactured at a high yield but also it is possible to prevent a change in thickness of a bonding material (for example, solder) even when the semiconductor module is introduced into a high temperature furnace for melting the bonding material and hence, it is possible to provide a highly reliable semiconductor module.

According to the semiconductor module 1 of the embodiment 1, the bonding portion 33 and the surrounding wall portion 34 are formed of one copper layer. Accordingly, there is no possibility that the surrounding wall portion 34 is inclined. Accordingly, in the steps of manufacturing the semiconductor module, there is no possibility that the second substrate 30 is rotated in the θ direction as viewed in a plan view and hence, it is possible to accurately position the second substrate 30.

Embodiment 2

A semiconductor module 2 of the embodiment 2 has substantially the same configuration as the semiconductor module 1 of the embodiment 1. However, the semiconductor module 2 of the embodiment 2 differs from the semiconductor module 1 of the embodiment 1 with respect to the configuration of a power device part. That is, in the semiconductor module 2 of the embodiment 2, as shown in FIG.

3, the power device part has the structure where two semiconductor elements 20a, 20b are stacked on each other.

In both of two semiconductor elements 20a, 20b, first electrodes 21a, 21b are formed on one surface of the semiconductor element 20a, 20b and second electrodes 22a, 22b and gate electrodes 23a, 23b are formed on the other surface of the semiconductor element 20a, 20b. Two semiconductor elements 20a, 20b are stacked on each other such that respective gate electrodes 23a, 23b of two semiconductor elements 20a, 20b are positioned at positions which do not overlap with each other as viewed in a plan view. That is, two semiconductor elements 20a, 20b are stacked on each other in a state where two semiconductor elements 20a, 20b are displaced from each other by an angle of 90°.

The respective gate electrodes 23a, 23b are connected with output terminals 52a, 52b of different control ICs 50a, 50b.

Figure 3A:
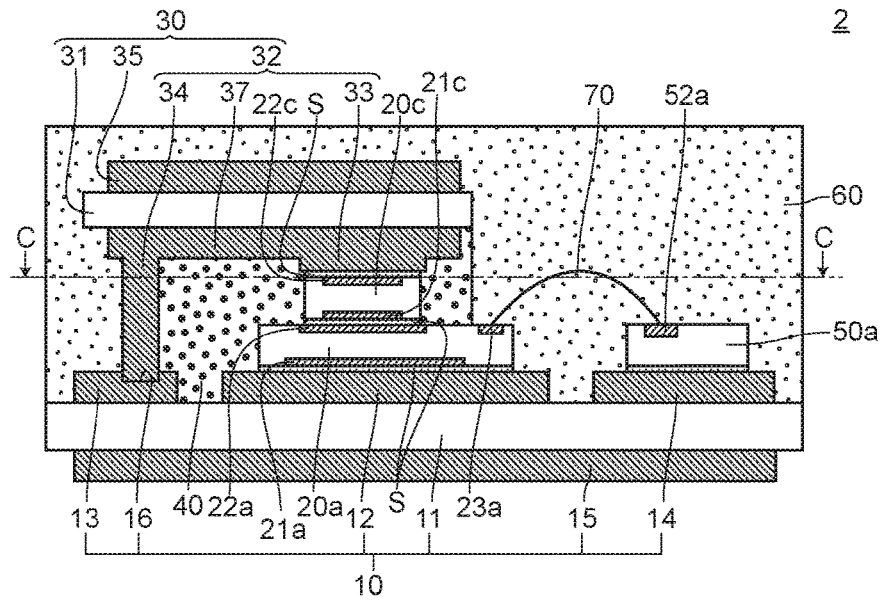
Figure 3B:
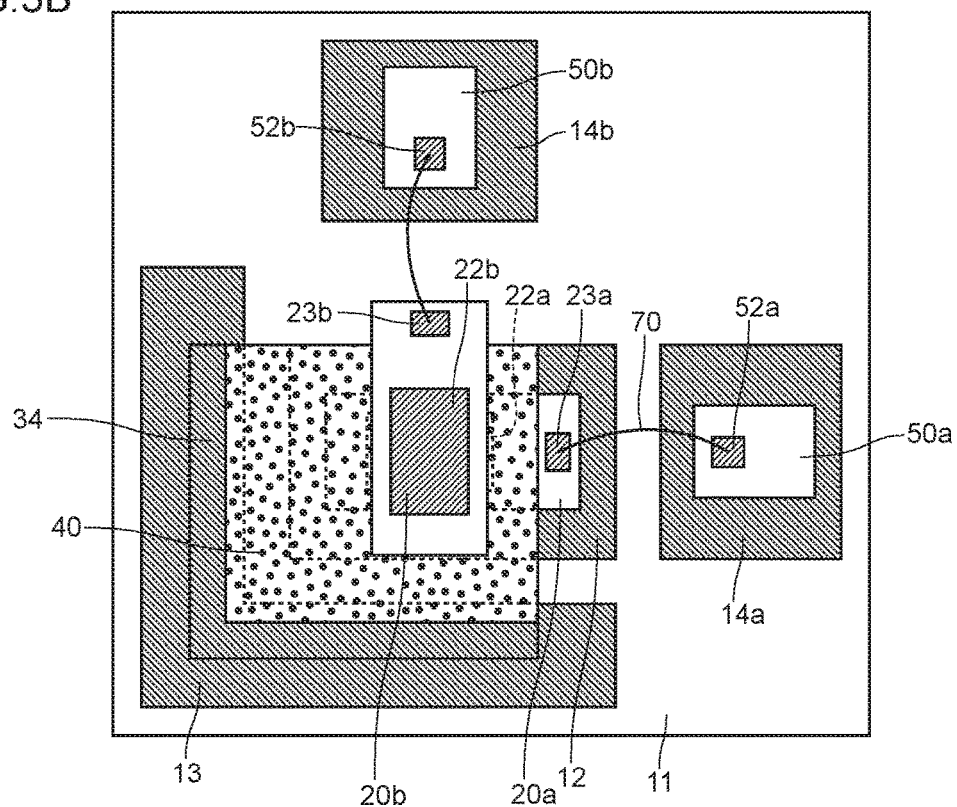

A surrounding wall portion 34 is formed only at a position which surrounds ½ of the whole circumference of a bonding portion 33 of the position which surrounds the bonding portion 33 as viewed in a plan view (see FIG. 3B). That is, the surrounding wall portion 34a has an L shape as viewed in a plan view.

In this manner, the semiconductor module 2 of the embodiment 2 differs from the semiconductor module 1 of the embodiment 1 with respect to the configuration of a power device part. However, in the same manner as the semiconductor module 1 of the embodiment 1, the power device part is disposed such that the gate electrodes 23a, 23b are positioned outside a region defined by the surrounding wall portion 34 as viewed in a plan view and hence, even in the case where a second substrate 30 is disposed over the most portion of the power device part, the gate electrodes 23a, 23b of the power device part and the output terminals 52a, 52b of the control ICs 50a, 50b can be connected with each other by wires 70 having a small diameter. As a result, it is possible to provide a semiconductor module where the power device part can be controlled by the control ICs 50a, 50b as the semiconductor module 2 of the embodiment 2.

According to the semiconductor module 2 of the embodiment 2, the power device part has the structure where two semiconductor elements 20a, 20b are stacked on each other. With such a configuration, an area occupied by two semiconductor elements 20a, 20b can be narrowed compared to the case where two semiconductor elements 20a, 20b are disposed in a juxtaposed manner on one surface of the first insulating substrate 11. As a result, it is possible to provide a semiconductor module which satisfies a demand for miniaturization of a product.

According to the semiconductor module 2 of the embodiment 2, two semiconductor elements 20a, 20b are stacked on each other such that respective gate electrodes 23a, 23b of two semiconductor elements 20a, 20b are positioned at positions which do not overlap with each other as viewed in a plan view. Accordingly, the respective gate electrodes 23a, 23b and the output terminals 52a, 52b of the control ICs 50a, 50b can be connected with each other through the wires 70 without being obstructed by other semiconductor elements and the surrounding wall portion 34 and hence, respective semiconductor elements 20a, 20b can be controlled by the control ICs 50a, 50b. As a result, it is possible to provide a semiconductor module capable of controlling the respective semiconductor elements while satisfying a demand for miniaturization of a product.

The semiconductor module 2 of the embodiment 2 has substantially the same configuration as the semiconductor module 1 of the embodiment 1 with respect to points except for the configuration of the power device part. Accordingly, out of the advantageous effects which the semiconductor module 1 of the embodiment 1 acquires, the semiconductor module 2 of the embodiment 2 can acquire advantageous effects brought about by the substantially same configuration.

Modification 1

Figure 4:
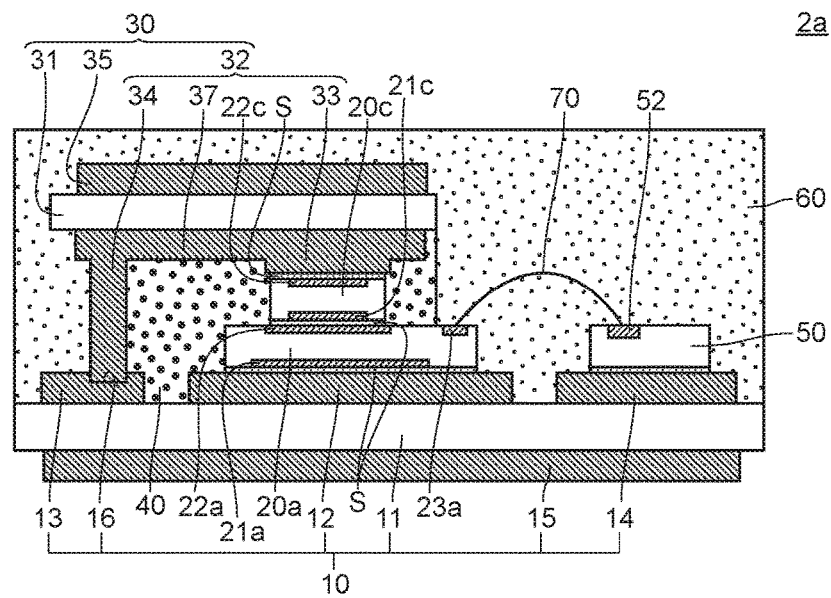
FIG. 4 is a cross-sectional view showing a semiconductor module 2a according to a modification 1.

A semiconductor module 2a of the modification 1 has substantially the same configuration as the semiconductor module 2 of the embodiment 2. However, the semiconductor module 2a of the modification 1 differs from the semiconductor module 2 of the embodiment 2 with respect to the configuration of a power device part. That is, in the semiconductor module 2a of the modification 1, as shown in FIG. 4, the power device part has the structure where a semiconductor element 20c having two terminals is stacked on a semiconductor element 20a having three terminals.

In the semiconductor module 2a of the modification 1, the electrical connection of the semiconductor element 20c having two terminals is configured such that a first electrode 21c formed on one surface (lower side surface) is electrically connected with a second electrode 22a of the semiconductor element 20a having three terminals, and a second electrode 22c formed on the other surface (upper side surface) is electrically connected with a bonding portion 33.

In this manner, the semiconductor module 2a of the modification 1 differs from the semiconductor module 2 of the embodiment 2 with respect to the configuration of a power device part. However, in the same manner as the semiconductor module 2 of the embodiment 2, the power device part is disposed such that a gate electrode 23a is positioned outside a region defined by a surrounding wall portion 34 as viewed in a plan view and hence, even in the case where a second substrate 30 is disposed over the most portion of the power device part, the gate electrode 23a of the power device part and the output terminal 52 of a control IC 50 can be connected with each other by a wire 70 having a small diameter. As a result, it is possible to provide a semiconductor module where the power device part can be controlled by the control IC 50 as the semiconductor module 2a of the modification 1.

Embodiment 3

Figure 5:
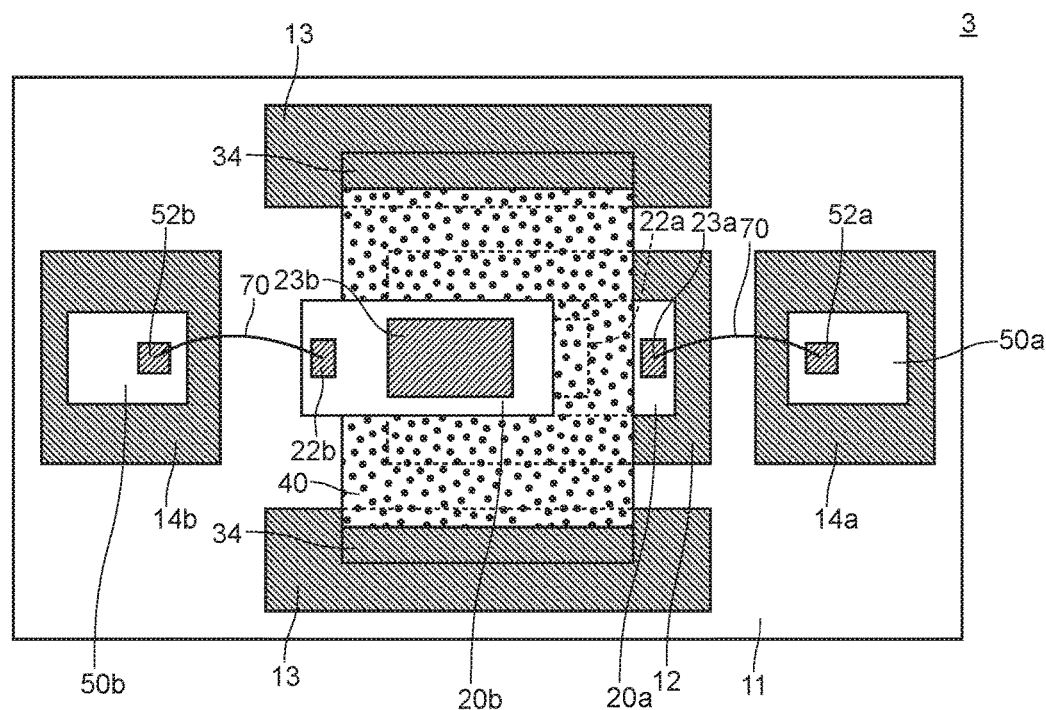
FIG. 5 is a planner cross-sectional view showing a semiconductor module 3 according to an embodiment 3.

A semiconductor module 3 of the embodiment 3 has substantially the same configuration as the semiconductor module 2 of the embodiment 2. However, the semiconductor module 3 of the embodiment 3 differs from the semiconductor module 2 of the embodiment 2 with respect to the configuration of a power device part. That is, in the semiconductor module 3 of the embodiment 3, as shown in FIG. 5, the power device part has the structure where two semiconductor elements 20a, 20b are stacked in a state where the semiconductor elements 20a, 20b are displaced from each other by 180°.

A surrounding wall portion 34 is formed only at a position (a position where two linear lines having a straight line shape become parallel to each other) among positions which surround a bonding portion 33 as viewed in a plan view.

In this manner, the semiconductor module 3 of the embodiment 3 differs from the semiconductor module 2 of the embodiment 2 with respect to the configuration of the power device part. However, in the same manner as the semiconductor module 2 of the embodiment 2, the power device part is disposed such that gate electrodes 23a, 23b are positioned outside a region defined by the surrounding wall portion 34 as viewed in a plan view and hence, even in the case where a second substrate 30 is disposed over the most portion of the power device part, the gate electrodes 23a, 23b of the power device part and output terminals 52a, 52b of control ICs 50a, 50b can be connected with each other by wires 70 having a small diameter. As a result, it is possible to provide a semiconductor module where the power device part can be controlled by the control ICs 50a, 50b as the semiconductor module 3 of the embodiment 3.

According to the semiconductor module 3 of the embodiment 3, the power device part has the structure where two semiconductor elements 20a, 20b are stacked in a state where the semiconductor elements 20a, 20b are displaced from each other by 180°. Accordingly, a distance between the gate electrode 23a and the gate electrode 23b can be increased and hence, a possibility that an electric discharge occurs between the gate electrodes can be eliminated with certainty.

According to the semiconductor module 3 of the embodiment 3, the power device part has the structure where two semiconductor elements 20a, 20b are stacked in a state where the semiconductor elements 20a, 20b are displaced from each other by 180°. Accordingly, a semiconductor module can be disposed in a relatively elongated region.

The semiconductor module 3 of the embodiment 3 has substantially the same configuration as the semiconductor module 2 of the embodiment 2 with respect to points except for the configuration of the power device part. Accordingly, out of the advantageous effects which the semiconductor module 2 of the embodiment 2 acquires, the semiconductor module 3 of the embodiment 3 can acquire advantageous effects brought about by the substantially same configuration.

Embodiment 4

Figure 6A:
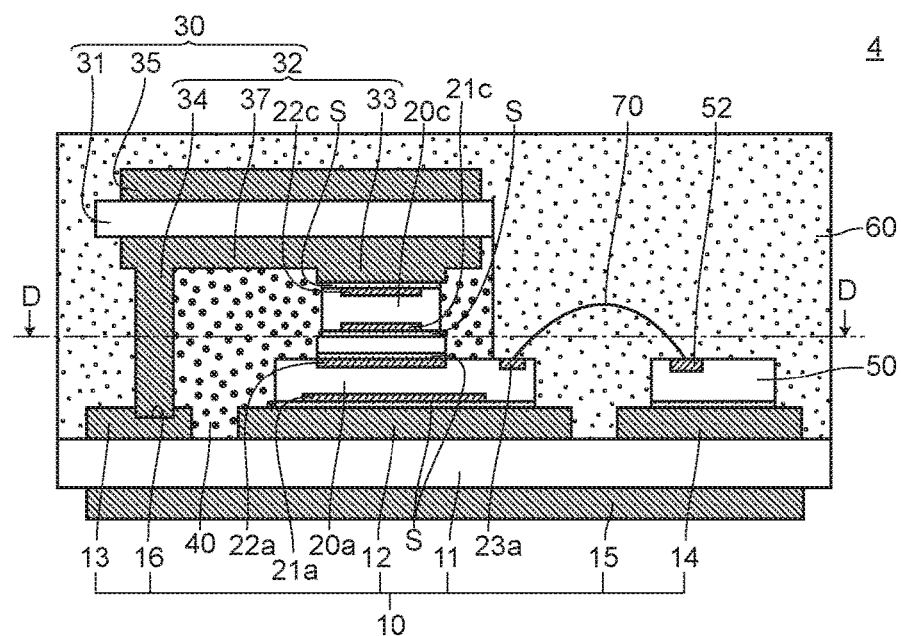
Figure 6B:
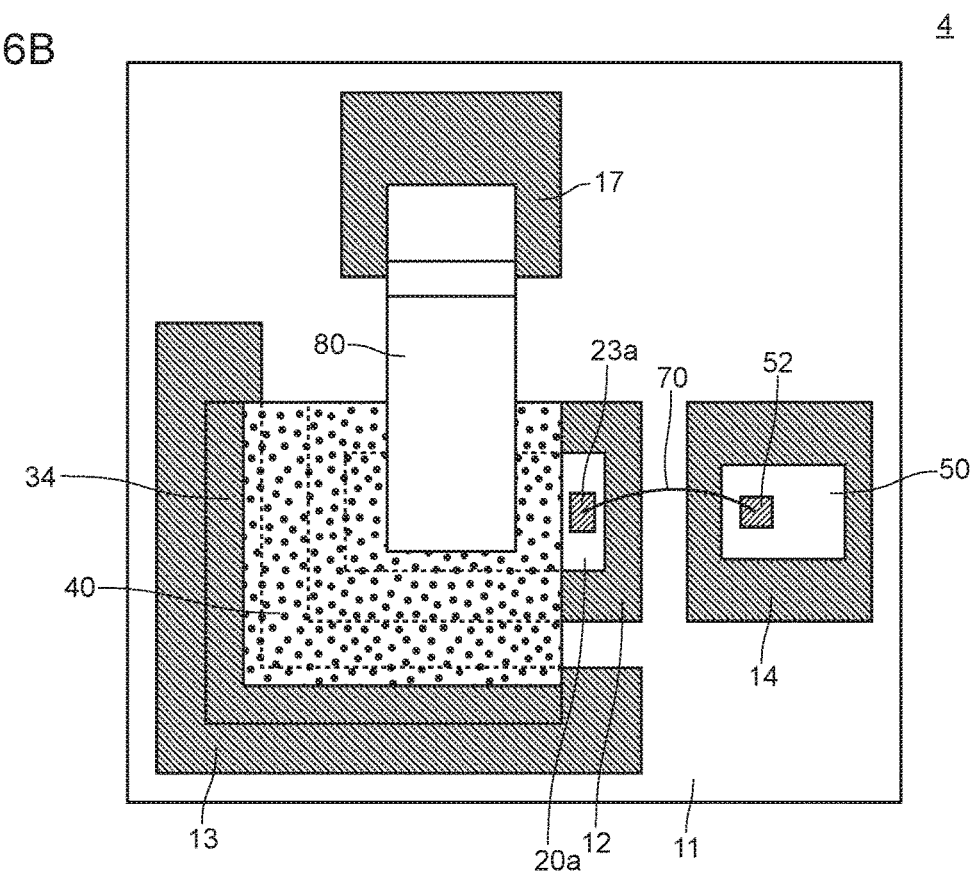

A semiconductor module 4 of the embodiment 4 has substantially the same configuration as the semiconductor module 2a of the modification 1. However, the semiconductor module 4 of the embodiment 4 differs from the semiconductor module 2a of the modification 1 with respect to a point that a second electrode of a semiconductor element on a first substrate side and a first electrode of a semiconductor element on a second substrate side are connected with each other through a connecting member. That is, the semiconductor module 4 of the embodiment 4 differs from the semiconductor module 2a of the modification 1 with respect to a point that, as shown in FIG. 6, the second electrode 22a of the semiconductor element 20a on a first substrate side and the first electrode 21c of the semiconductor element 20c on a second substrate side are connected with each other through a connector (connecting member) 80.

The connector 80 is formed by bending a metal plate, and has a larger cross-sectional area than a wire thus having lower resistance than the wire. The connector 80 is disposed on one surface of the first insulating substrate 11, and is connected with a fifth conductor layer 17 which is disposed at a position spaced apart from a first conductor layer 12, a third conductor layer 13 and a fourth conductor layer 14.

In this manner, the semiconductor module 4 of the embodiment 4 differs from the semiconductor module 2a of the modification 1 with respect to a point that the second electrode of the semiconductor element on a first substrate side and the first electrode of the semiconductor element on a second substrate side are connected with each other through the connecting member. However, in the same manner as the semiconductor module 2a of the modification 1, the power device part is disposed such that a gate electrode 23 is positioned outside a region defined by a surrounding wall portion 34 as viewed in a plan view and hence, even in the case where a second substrate 30 is disposed over the most portion of a power device part, the gate electrode 23 of the power device part and an output terminal 52 of a control IC 50 can be connected with each other by a wire 70 having a small diameter. As a result, it is possible to provide a semiconductor module where the power device part can be controlled by the control IC 50 as the semiconductor module 4 of the embodiment 4.

According to the semiconductor module 4 of the embodiment 4, the connector 80 has a larger cross-sectional area and the lower resistance than the wire and hence, when a large electric current is supplied to the semiconductor module, drawbacks minimally occur and hence, it is possible to provide a semiconductor module having further reliability.

The semiconductor module 4 of the embodiment 4 has substantially the same configuration as the semiconductor module 2a of the modification 1 with respect to points except for a point that the second electrode of the semiconductor element on a first substrate side and the first electrode of the semiconductor element on a second substrate side are connected with each other through the connecting member. Accordingly, out of the advantageous effects which the semiconductor module 2a of the modification 1 acquires, the semiconductor module 4 of the embodiment 4 can acquire advantageous effects brought about by the substantially same configuration.

Embodiment 5

Figure 7:
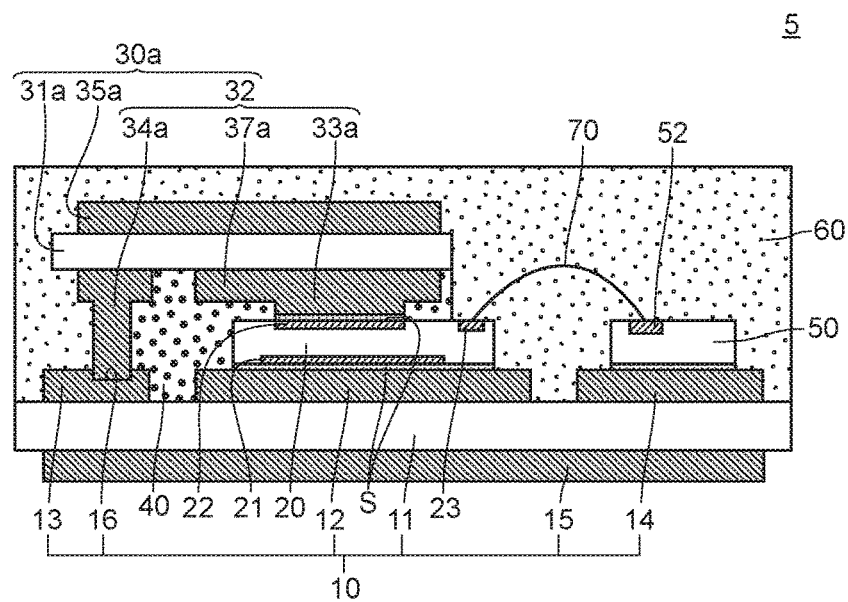
FIG. 7 is a cross-sectional view showing a semiconductor module 5 according to an embodiment 5.
Figure 8A:
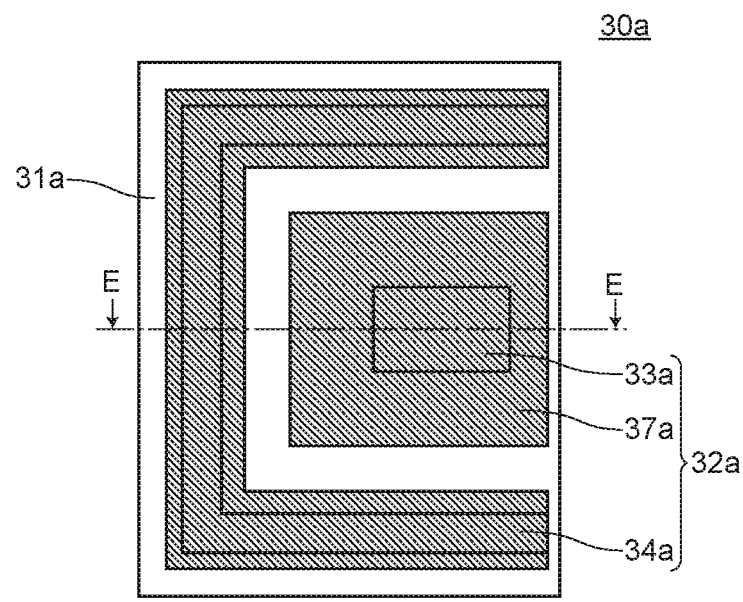
Figure 8B:
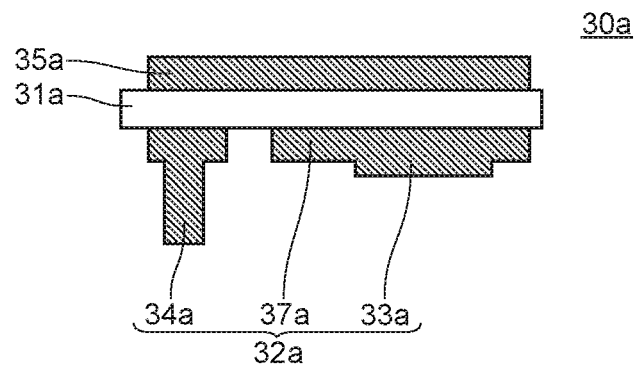

A semiconductor module 5 of the embodiment 5 has substantially the same configuration as the semiconductor module 1 of the embodiment 1. However, the semiconductor module 5 of the embodiment 5 differs from the semiconductor module 1 of the embodiment 1 with respect to the configuration of a second conductor layer. That is, in the second conductor layer 32a of the semiconductor module 5 of the embodiment 5, as shown in FIG. 7 and FIG. 8, a surrounding wall portion 34a is formed in a state where the surrounding wall portion 34a is spaced apart from a bonding portion 33a.

A first substrate 10 further includes a third conductor layer 13 bonded to the surrounding wall portion 34a at a position spaced apart from a first conductor layer 12 on one surface of a first insulating substrate 11, and a groove portion 16 is formed on the third conductor layer 13 for making the third conductor layer 13 and the surrounding wall portion 34a engage with each other.

In this manner, the semiconductor module 5 of the embodiment 5 differs from the semiconductor module 1 of the embodiment 1 with respect to the configuration of the second conductor layer. However, in the same manner as the semiconductor module 1 of the embodiment 1, a power device part is disposed such that a gate electrode 23 is positioned outside a region defined by the surrounding wall portion 34 as viewed in a plan view and hence, even in the case where a second substrate 30 is disposed over the most portion of the power device part, the gate electrode 23 of the power device part and an output terminal 52 of a control IC 50 can be connected with each other by a wire 70 having a small diameter. As a result, it is possible to provide a semiconductor module where the power device part can be controlled by the control IC 50 as the semiconductor module 5 of the embodiment 5.

Further, in the semiconductor module 5 of the embodiment 5, the surrounding wall portion 34*a* is formed in a state where the surrounding wall portion 34*a* is spaced apart from the bonding portion 33*a*. With such a configuration, short-circuiting with other conductor layers or semiconductor elements through the surrounding wall portion 34*a* can be prevented and hence, it is possible to provide a semiconductor module which is minimally broken.

The semiconductor module 5 of the embodiment 5 has substantially the same configuration as the semiconductor module 1 of the embodiment 1 with respect to points except for the configuration of the second conductor layer. Accordingly, out of the advantageous effects which the semiconductor module 1 of the embodiment 1 acquires, the semiconductor module 5 of the embodiment 5 can acquire advantageous effects brought about by the substantially same configuration.

Embodiment 6

Figure 9:
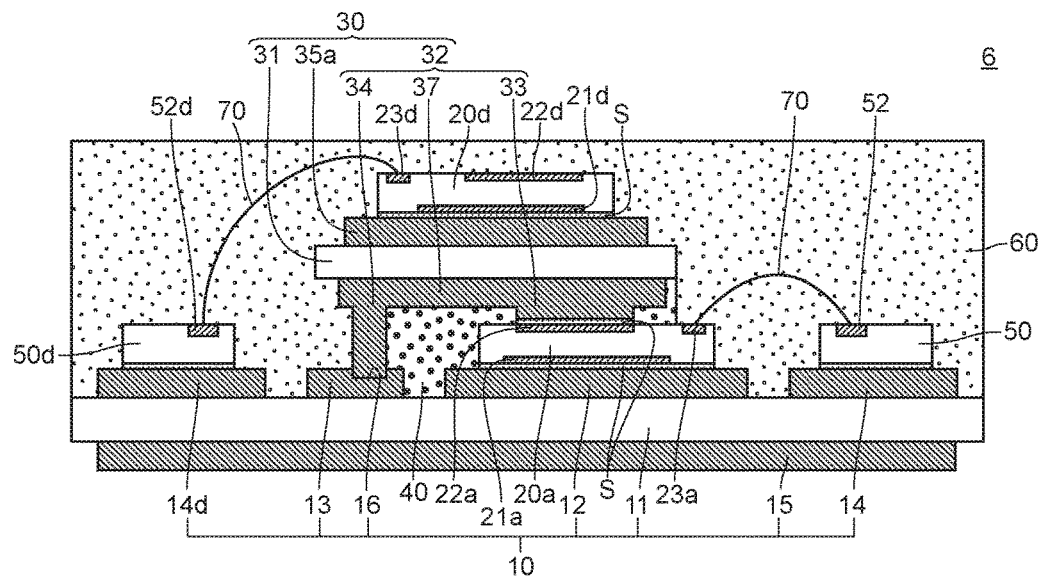
FIG. 9 is a cross-sectional view showing a semiconductor module 6 according to an embodiment 6.

A semiconductor module 6 of the embodiment 6 has substantially the same configuration as the semiconductor module 1 of the embodiment 1. However, the semiconductor module 6 of the embodiment 6 differs from the semiconductor module 1 of the embodiment 1 with respect to a point that a power device part is disposed also on the other surface side of a second substrate. That is, in the semiconductor module 6 of the embodiment 6, as shown in FIG. 9, a power-device-part mounting conductor layer 35*a* is formed on the other surface side of the second substrate 30, and a second power device part is formed on the power-device-part mounting conductor layer 35*a*.

The second power device part is formed of one semiconductor element 20*d*, wherein a first electrode 21*d* is formed on one surface of the semiconductor element 20*d*, and a second electrode 22*d* and a gate electrode 23*d* are formed on the other surface of the semiconductor element 20*d*. The first electrode 21*d* is connected to a conductor layer (not shown in the drawing) formed on one surface of a first substrate 10 by a connecting member (not shown in the drawing), the second electrode 22*d* is electrically connected with the power-device-part mounting conductor layer 35*a*, and the gate electrode 23*d* is electrically connected to a control IC 50*d* (different from a control IC 50) through a wire 70. The power-device-part mounting conductor layer 35*a* is insulated from the second conductor layer 32 by a second insulating substrate 31.

In this manner, the semiconductor module 6 of the embodiment 6 differs from the semiconductor module 1 of the embodiment 1 with respect to a point that the power device part is disposed also on the other surface side of the second substrate. However, in the same manner as the semiconductor module 1 of the embodiment 1, the power device part is disposed such that the gate electrode 23 is positioned outside a region defined by the surrounding wall portion 34 as viewed in a plan view and hence, even in the case where the second substrate 30 is disposed over the most portion of the power device part, the gate electrode 23 of the power device part and an output terminal 52 of the control IC 50 can be connected with each other by the wire 70 having a small diameter. As a result, it is possible to provide a semiconductor module where the power device part can be controlled by the control IC 50 as the semiconductor module 6 of the embodiment 6.

According to the semiconductor module 6 of the embodiment 6, the power-device-part mounting conductor layer 35*a* is formed on the other surface side of the second substrate 30, and the second power device part (semiconductor element 20*d*) is formed on the power-device-part mounting conductor layer 35*a*. With such a configuration, an area occupied by two semiconductor elements 20*a*, 20*d* can be narrowed compared to the case where two semiconductor elements 20*a*, 20*d* are disposed in a juxtaposed manner on one surface of the first insulating substrate 11. As a result, it is possible to provide a semiconductor module which satisfies a demand for miniaturization of a product.

The semiconductor module 6 of the embodiment 6 has the same configuration as the semiconductor module 1 of the embodiment 1 with respect to points except for a point that the power device part is disposed also on the other surface side of the second substrate. Accordingly, out of the advantageous effects which the semiconductor module 1 of the embodiment 1 acquires, the semiconductor module 6 of the embodiment 6 can acquire advantageous effects brought about by the substantially same configuration.

Modification 2

Figure 10:
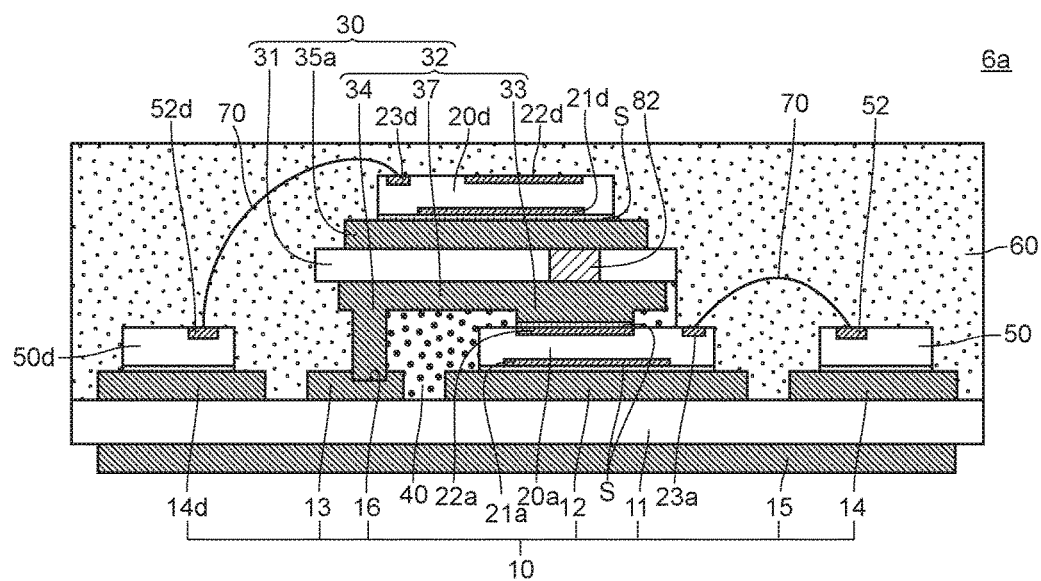
FIG. 10 is a cross-sectional view showing a semiconductor module 6a according to a modification 2.

A semiconductor module 6*a* of the modification 2 has substantially the same configuration as the semiconductor module 6 of the embodiment 6. However, the semiconductor module 6*a* of the modification 2 differs from the semiconductor module 6 of the embodiment 6 with respect to a point that a power-device-part mounting conductor layer 35*a* is electrically connected to a second conductor layer 32. That is, in the semiconductor module 6*a* of the modification 2, as shown in FIG. 10, a hole is formed in the second insulating substrate 31 at a position corresponding to a bonding portion 33, a connecting member 82 is disposed in the inside of the hole which is formed in the second insulating substrate 31, and the power-device-part mounting conductor layer 35*a* is electrically connected to the second conductor layer 32 through the connecting member 82. The connecting member 82 is formed by blanking or bending a metal sheet.

In this manner, the semiconductor module 6*a* of the modification 2 differs from the semiconductor module 6 of the embodiment 6 with respect to a point that the power-device-part mounting conductor layer 35*a* is electrically connected to the second conductor layer 32. However, in the same manner as the semiconductor module 6 of the embodiment 6, the power device part is disposed such that a gate electrode 23*a* is positioned outside a region defined by a surrounding wall portion 34 as viewed in a plan view and hence, even in the case where a second substrate 30 is disposed over the most portion of the power device part, the gate electrode 23*a* of the power device part and an output terminal 52 of a control IC 50 can be connected with each other by a wire 70 having a small diameter. As a result, it is possible to provide a semiconductor module where the power device part can be controlled by the control IC 50 as the semiconductor module 6*a* of the modification 2.

Although the present invention has been described based on the above-mentioned embodiments heretofore, the present invention is not limited to the above-mentioned embodiments. Various modes can be carried out without departing from the gist of the present invention, and the following modifications are also conceivable, for example.

(1) The numbers, materials, shapes, positions and sizes of the constitutional elements described in the above-mentioned embodiments are provided only for an exemplifying the semiconductor module according to the present invention, and can be changed within a range that advantageous effects of the present invention are not impaired.

Figure 11:
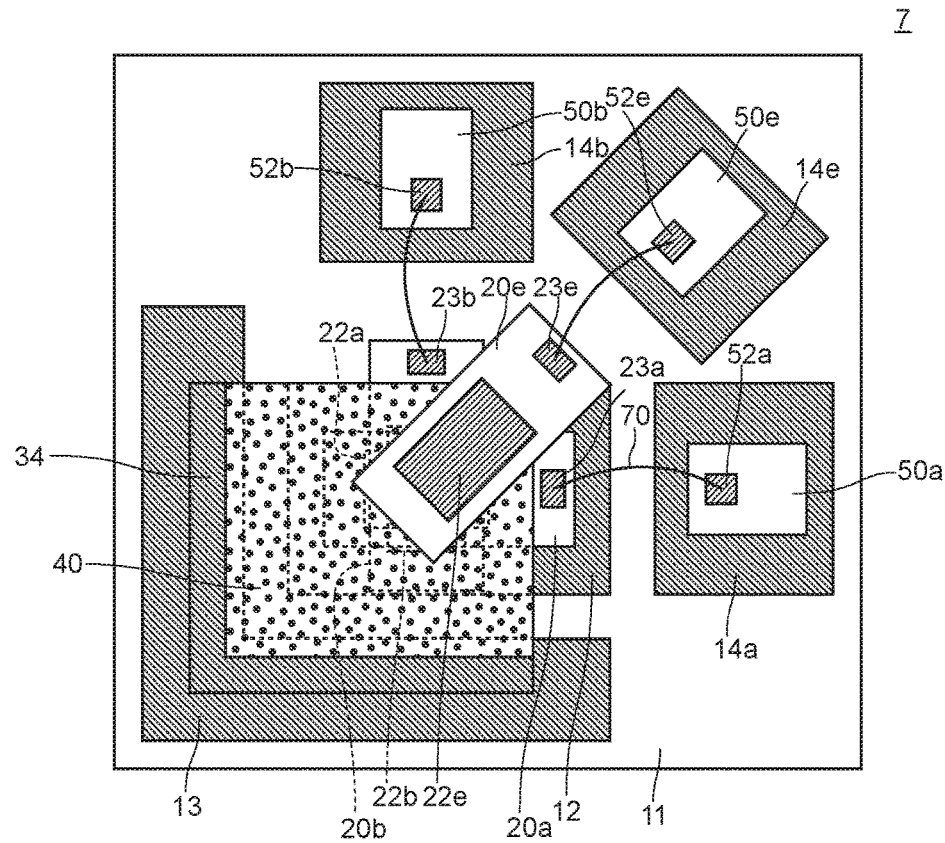
FIG. 11 is a planar cross-sectional view showing a semiconductor module 7 according to a modification 3.
Figure 12:
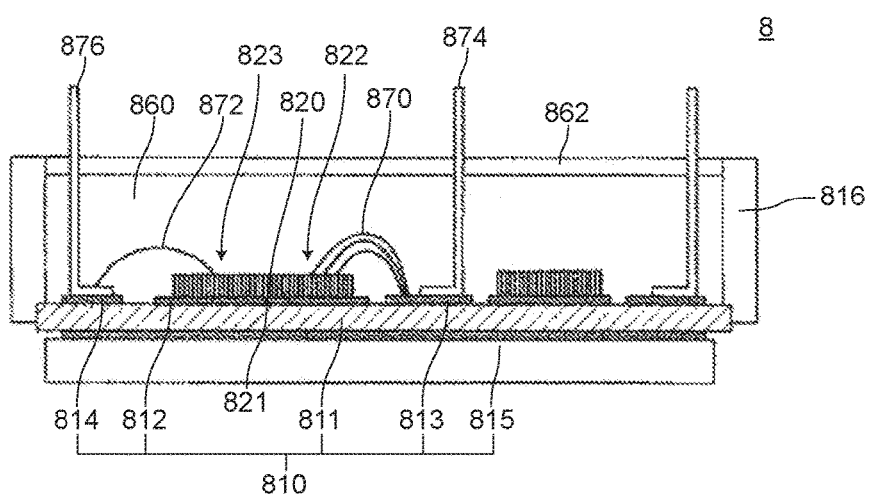
FIG. 12 is a cross-sectional view showing a conventional semiconductor module 8, wherein symbol 815 indicates a heat radiation conductor layer of a substrate 810.
Figure 13:
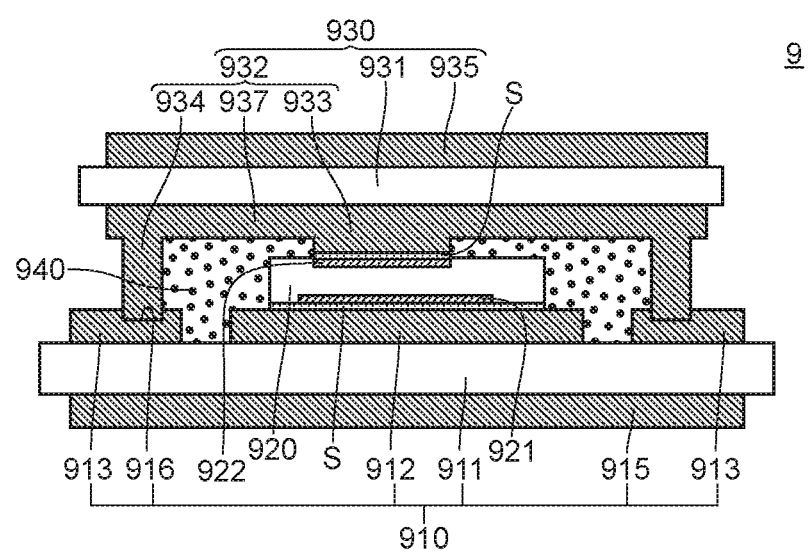
FIG. 13 is a cross-sectional view showing a semiconductor module 9 according to a prior patent application. In the drawing, symbol 913 indicates a third conductor layer, symbol 915 indicates a heat radiation conductor layer of a first substrate 910, symbol 916 indicates a groove portion, symbol 935 indicates a heat radiation conductor layer of a second substrate 930, symbol 937 indicates a flat portion, and symbol S indicates a solder.

(2) In the above-mentioned embodiments 2 to 4, the power device part has the structure where two semiconductor elements are stacked on each other. However, the present invention is not limited to such a power device part structure. For example, the power device part may have a structure where three or more semiconductor elements are stacked on each other (semiconductor module 7 of modification 3, see FIG. 11).

(3) In the above-mentioned embodiment 2, two semiconductor elements are stacked on each other in a state where two semiconductor elements are displaced from each other by an angle of 90°, and in the above-mentioned embodiment 3, two semiconductor elements are stacked on each other in a state where two semiconductor elements are displaced from each other by an angle of 180°. However, the present invention is not limited to such cases. For example, two or more semiconductor elements may be stacked on each other in a state where two or more semiconductor elements are displaced from each other by an angle of 45° (for example, semiconductor module 7 of modification 3, see FIG. 11), and two or more semiconductor elements may be stacked on each other in a state where two or more semiconductor elements are displaced from each other by an angle other than the above-mentioned angles.

(4) In the above-mentioned respective embodiments, the first substrate is a DCB substrate. However, the present invention is not limited to such a substrate. For example, the first substrate may be a printed circuit board used in general or an aluminum substrate.

(5) In the above-mentioned respective embodiments, the second substrate is a DCB substrate. However, the present invention is not limited to such a substrate. For example, the second substrate may be a printed circuit board used in general or an aluminum substrate.

(6) In the above-mentioned embodiments 1 to 5, the heat radiation conductor layer is formed on the other surface side of the first substrate and the other surface side of the second substrate. However, the present invention is not limited to such an arrangement. For example, a conductor layer for mounting an electronic part may be formed on at least one of the other surface side of the first substrate and the other surface side of the second substrate, or a conductor layer per se may not be formed. Further, a heat radiation fin may be disposed on the heat radiation conductor layer 15 (or heat radiation conductor layer 35).

(7) In the above-mentioned respective embodiments, the bonding portion and the surrounding wall portion are formed by etching one conductor layer. However, the present invention is not limited to such a case. The bonding portion and the surrounding wall portion may be formed by forming a bonding portion forming member and a surrounding wall portion forming member separately and by bonding these members to the second substrate.

(8) In the above-mentioned embodiments 3 and 4, the groove portion is formed on the third conductor layer for making the third conductor layer and the surrounding wall portion engage with each other. However, the present invention is not limited to such a case. The groove portion may not be formed on the third conductor layer.

(9) In the above-mentioned embodiment 6, the second power device part is formed of one semiconductor element 20*d*. However, the present invention is not limited to such a case. The second power device part may have a structure where a plurality of semiconductor elements are stacked on each other.

The invention claimed is:

1. A semiconductor module comprising:
a first substrate having a first insulating substrate and a first conductor layer which is formed on at least one surface of the first insulating substrate;
a power device part having a first electrode on one surface thereof and a second electrode and a gate electrode on the other surface thereof and having the first electrode bonded to the first conductor layer;
a second substrate having a second insulating substrate and a second conductor layer formed on at least one surface of the second insulating substrate, wherein the second conductor layer has a bonding portion bonded to the second electrode and a surrounding wall portion formed at a position which surrounds the bonding portion as viewed in a plan view in a state where an upper end surface of the surrounding wall portion projects from a bonding surface between the bonding portion and the second electrode, and the second substrate is in contact with the first substrate by way of the surrounding wall portion;
an inner resin portion made of a resin and disposed in a space defined by the surrounding wall portion and sandwiched between the first insulating substrate and the second insulating substrate;
a control IC disposed at a position being spaced apart from the power device part; and
an outer resin portion made of a resin and disposed on one surface side of the first substrate so as to cover at least the second substrate and the control IC, wherein
the power device part is disposed such that the gate electrode is positioned outside a region defined by the surrounding wall portion as viewed in a plan view, and
the gate electrode is electrically connected to an output terminal of the control IC through a predetermined connecting member.

2. The semiconductor module according to claim 1, wherein the surrounding wall portion is formed only at a predetermined portion of a position which surrounds the bonding portion as viewed in a plan view.

3. The semiconductor module according to claim 1, wherein the power device part is formed of one semiconductor element, and
the semiconductor element has a first electrode on one surface thereof and has a second electrode and a gate electrode on the other surface thereof.

4. The semiconductor module according to claim 1, wherein the power device part has the structure where a plurality of semiconductor elements are stacked,
both of at least two semiconductor elements among the plurality of semiconductor elements have a first electrode on one surface thereof and have a second electrode and a gate electrode on the other surface thereof, and
the at least two semiconductor elements are stacked such that the at least two semiconductor elements are positioned at a position where the gate electrodes of the at least two respective semiconductor elements do not overlap with each other as viewed in a plan view.

5. The semiconductor module according to claim 1, wherein the power device part has the structure where a plurality of semiconductor elements are stacked, and
at least one semiconductor element among the plurality of semiconductor elements has a first electrode on one surface thereof and has a second electrode and a gate electrode on the other surface thereof.

6. The semiconductor module according to claim 1, wherein the surrounding wall portion is formed continuously with the bonding portion, the first substrate further has a third conductor layer which is bonded to the surrounding wall portion at a position spaced apart from the first conductor layer on one surface of the first insulating substrate, and the third conductor layer is electrically connected to the second electrode through the surrounding wall portion and the bonding portion.

7. The semiconductor module according to claim 6, wherein a groove portion which engages with the surrounding wall portion is formed on the third conductor layer.

8. The semiconductor module according to claim 1, wherein the surrounding wall portion is formed in a state where the surrounding wall portion is spaced apart from the bonding portion.

9. The semiconductor module according to claim 8, wherein the first substrate further has a third conductor layer which is bonded to the surrounding wall portion at a position spaced apart from the first conductor layer on one surface of the first insulating substrate, and a groove portion which engages with the surrounding wall portion is formed on the third conductor layer.

10. The semiconductor module according to claim 1, wherein a power-device-part mounting conductor layer is formed on the other surface of the second substrate, and a second power device part is disposed on the power-device-part mounting conductor layer.

11. The semiconductor module according to claim 10, wherein the second power device part has a first electrode which is electrically connected to the power-device-part mounting conductor layer on one surface thereof, a hole is formed in the second insulating substrate at a position corresponding to the bonding portion, a second connecting member is disposed in the inside of a hole formed in the second insulating substrate; and the first electrode of the second power device part is electrically connected to the second electrode of the power device part through the second connecting member.

12. The semiconductor module according to claim 1, wherein the bonding portion and the surrounding wall portion are formed of one copper layer.

* * * * *